United States Patent [19]
Tanimoto et al.

[11] Patent Number: 4,570,127

[45] Date of Patent: Feb. 11, 1986

[54] AUTOMATIC GAIN CONTROL CIRCUIT FOR BURST SIGNAL COMMUNICATION SYSTEM

[75] Inventors: Yoshio Tanimoto; Masaaki Atobe, both of Tokyo, Japan

[73] Assignee: NEC Corporation, Tokyo, Japan

[21] Appl. No.: 569,257

[22] Filed: Jan. 9, 1984

[30] Foreign Application Priority Data

Jan. 14, 1983 [JP] Japan .................. 58-4745

[51] Int. Cl.⁴ .............................. H03G 3/20
[52] U.S. Cl. .................. 330/137; 330/138; 330/279; 330/280
[58] Field of Search ............ 330/129, 132, 137, 138, 330/279, 280; 375/98; 455/234, 242

[56] References Cited

FOREIGN PATENT DOCUMENTS 52-4150 1/1977 Japan ........................ 330/129
658712 4/1979 U.S.S.R. ..................... 330/129

OTHER PUBLICATIONS

"μ PB 74LS 123C, Dual Retriggerable Monostable Multivibrators with Clear", *Los Power Schottky TTL μ PB 74LS Series*, pp. 107-109, Published 1981.
"μ PB 74LS 193C, Binary Up/Down Counter", *Los Power Schottky TTL μ PB 74LS Series*, pp. 172-174, Published 1981.
Texas Instruments Catalog Sheets SN54122 and SN54192, *The TTL Data Book for Design Engineers* (Second edition), pp. 6-76–6-81, 7-306–7-310, and 7-314, 7-315.

*Primary Examiner*—James B. Mullins
*Attorney, Agent, or Firm*—Laff, Whitesel, Conte & Saret

[57] ABSTRACT

An AGC circuit for amplifying burst signals has output power which does not vary, regardless of variations in the burst time. This automatic gain control (AGC) circuit has an amplifier for receiving a burst signal input and providing an amplified burst output. The level of amplification is controlled in response to a control signal applied to the amplifier. A negative feedback circuit includes an envelope detector for receiving the burst output and a circuit for providing a comparison signal in response to a comparison between the voltage leads of the detected envelope signal and a reference voltage. The comparison signal is converted into a binary signal which is counted down to provide the amplifier control signal.

9 Claims, 28 Drawing Figures

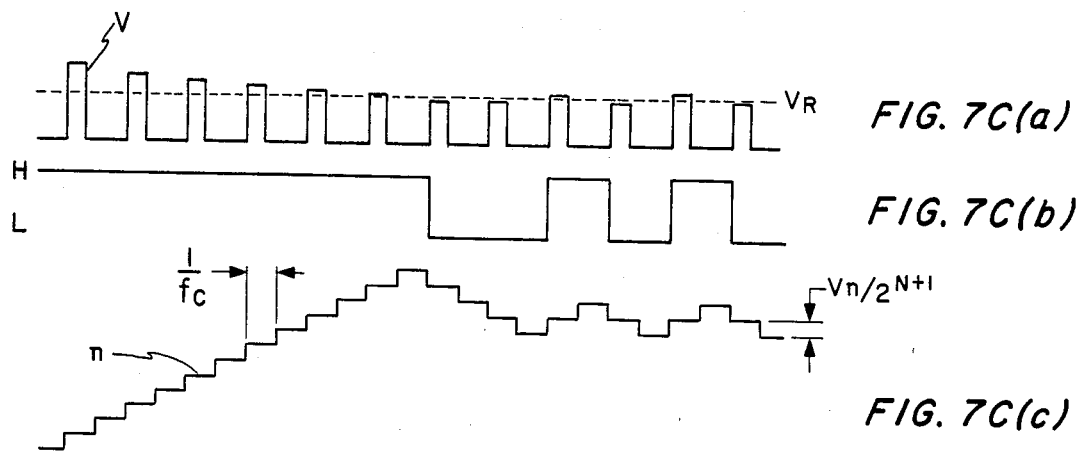
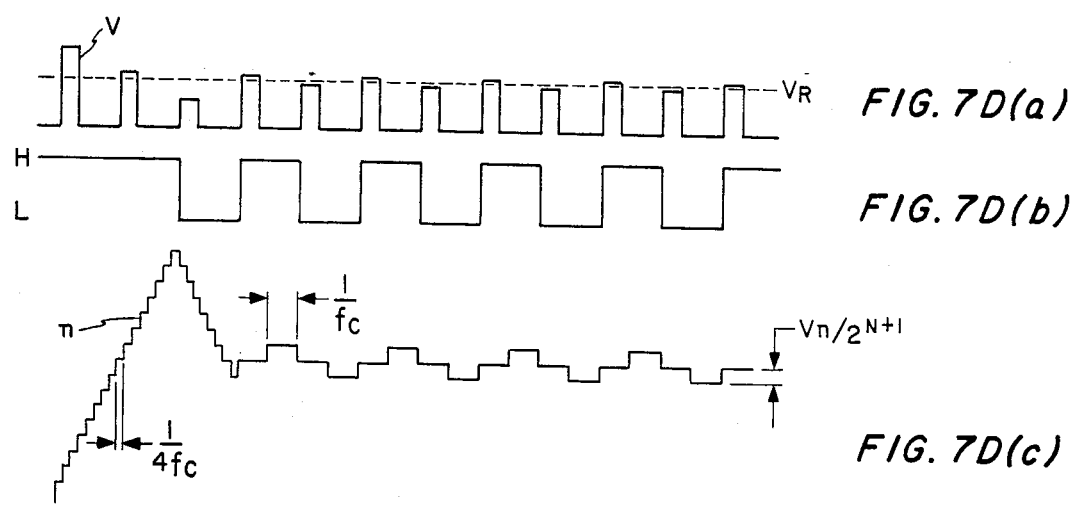

AUTOMATIC GAIN CONTROL CIRCUIT FOR BURST SIGNAL COMMUNICATION SYSTEM

BACKGROUND OF THE INVENTION

The present invention relates to an automatic gain control (AGC) circuit for use in the transmission and reception of burst signals in a time division multiple access (TDMA) system, or the like.

One of the systems used in satellite communication, and the like, is known as the burst communication system, in which a transmitting action is performed only when information is to be conveyed. This burst communication system has the advantages that the power consumption can be reduced and that the same satellite and the same frequency band can be used for communication between many different transmitting and receiving stations.

In a transmitter for the burst communication system, an AGC amplifier is used for keeping constant the variation of transmitting power which is caused by temperature fluctuation or by switching the transmission path. In a receiver, an AGC amplifier is used for keeping constant the variation of the reception input power, thereby stabilizing the demodulating action. It is customary in such an AGC circuit for burst signals to achieve AGC by the use of a negative feedback bias responsive to charging/discharging or time constant circuit having a peak holding function.

However, as will be described in detail below, a conventional AGC circuit for burst signals has the disadvantage that a change in burst time would invite a variation in the output power of the AGC circuit, so that it could not achieve its intended purpose to keep the output power constant. As a result, if the circuit is used in a transmitter, the transmitting power may vary; or, if it is used in a receiver, the input to the demodulator circuit may vary, to adversely affect its receiving function.

SUMMARY OF THE INVENTION

An object of the present invention, therefore, is to provide an AGC circuit for burst signals. The output power of the AGC circuit will not vary regardless of variation in the burst time.

According to this invention, an automatic gain control (AGC) circuit for a burst signal communication system comprises an AGC amplifier means for receiving a burst input and for providing a burst output. The level of the burst signal is controlled in response to a control signal. A negative feedback circuit means includes an envelope detector means, for receiving the burst output and for providing the control signal. The negative feedback circuit means comprises the envelope detector means for envelope detecting the burst output and providing a first signal. A converting means converts the first signal into a binary signal by comparing it with a reference voltage. A pulse generator means provides a pulse signal having a predetermined pulse width, in response to the binary signal. The AGC amplifier driving circuit means digitally processes the pulse signal, thereby providing the control signal.

BRIEF DESCRIPTION OF THE DRAWINGS

Other features and advantages of the invention will be more apparent from the detailed description taken hereunder in conjunction with the accompanying drawings, wherein.

DETAILED DESCRIPTION OF THE INVENTION

Figure 1:
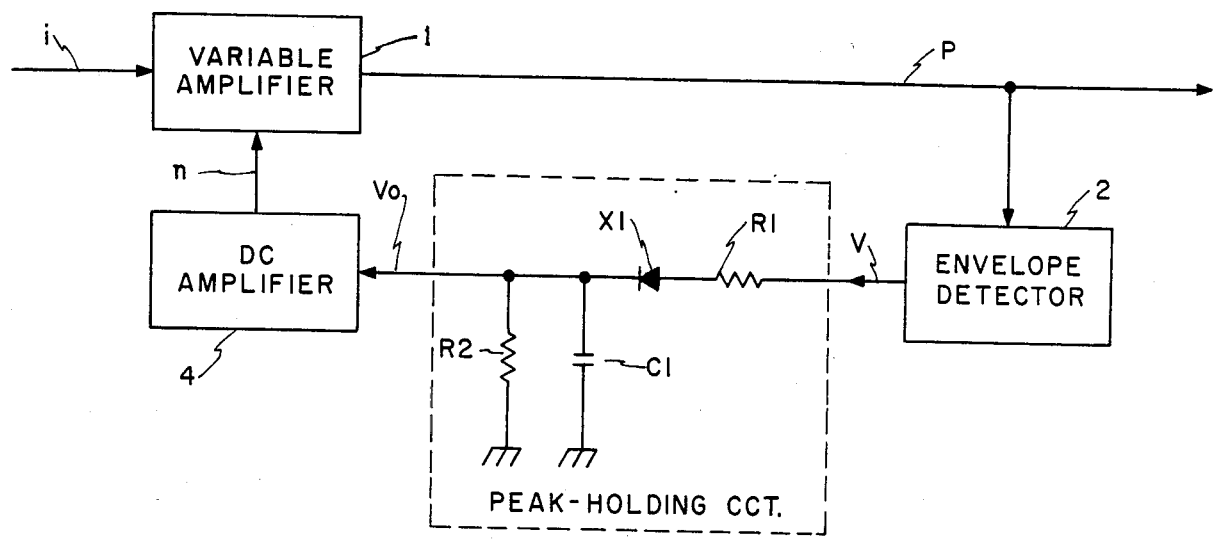
FIG. 1 is a block diagram illustrating the structure of a prior art AGC circuit for burst signals.

FIG. 1 is a block diagram illustrating the structure of a prior art AGC circuit for burst signals. In FIG. 1, the AGC circuit comprises a variable amplifier (or an AGC amplifier) 1, an envelope detector 2, a peak holding circuit 3 and a D.C. amplifier 4. The peak holding circuit 3 comprises a peak holding capacitor C1, a peak holding diode $X_1$, and resistors $R_1$ and $R_2$. Upon the arrival of a burst signal, the diode $X_1$ drops in resistance and makes it possible to charge capacitor C1. However, in the absence of a burst signal, the resistance of diode $X_1$ rises to keep the stored electric charge. The resistor $R_1$ determines the charging time, and the high resistor $R_2$ determines the discharging time. The D.C. amplifier 4 has both a high gain and high input impedance to prevent the electric charge on the capacitor $C_1$ from being discharged. In the peak-holding circuit 3, the charging time $\tau_a$ is determined by $\tau_a = R_1 C_1$, and the discharging time $\tau_b$, by $\tau_b = R_2 C_1$.

The operation of the circuit will be described next. A burst signal i is applied through a modulator and frequency converter (not shown), for example, to the variable amplifier 1 which amplifies the burst signal i in response to a control voltage n and which provides a burst output signal p. The envelope detector 2 envelope-detects the signal p and provides a detecting voltage v, which is peak-held by charging the capacitor $C_1$, through the diode $X_1$. The detecting voltage v, which is thereby peak-held, is amplified by the D.C. amplifier 4 to become the control voltage n, which keeps constant the level of the burst output signal p of the variable amplifier 1. Thus, the AGC circuit includes a negative feedback circuit comprising the detector 2, the circuit 4 and the amplifier 4.

The characteristics of the AGC circuit are determined by the control voltage-amplification relationship of the variable amplifier 1, the detecting sensitivity of the envelope detector 2, the amplification gain of the D.C. amplifier 4, and other pertinent characteristics. Also, in determining the charging time $\tau_a$ and the discharging time $\tau_b$ in the peak-holding circuit 3, the frame cycle $\tau_f$ and burst time $\tau$ of the burst signal i are taken into account. It is more desirable for $\tau_a$ to be smaller to make the AGC circuit quicker in response, and $\tau_b$ should preferably be greater to stabilize the peak-holding performance. To give a typical set of parameters, if $\tau_f = 750$ μs, $\tau = 1$ μs, $\tau_a = \tau \times 10 = 10$ μs and $\tau_b = \tau_f \times 100 = 75$ ms, then $C_1 = 0.1$ μF, $R_1 = 100$ Ω and $R_2 = 750$ KΩ. According to this example, the charging will be substantially completed when some ten burst signals (ten frames) have arrived. If no burst signals corresponding to 100 frame times have arrived, it will mean that the electric charge of the capacitor $C_1$ is discharged.

The burst time varies in a TDMA communications system because the quantity of information is variable, in accordance with the demands of the communicating stations. The charging and discharging responses will also change with these variations.

Figure 2A:
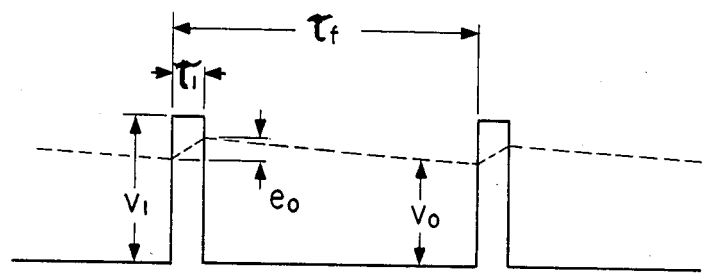
FIGS. 2A to 2C are diagrams specifically depicting the operation of the circuit illustrated in FIG. 1.
Figure 2B:
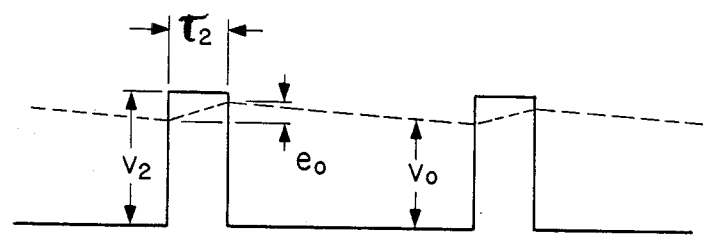
Figure 2C:
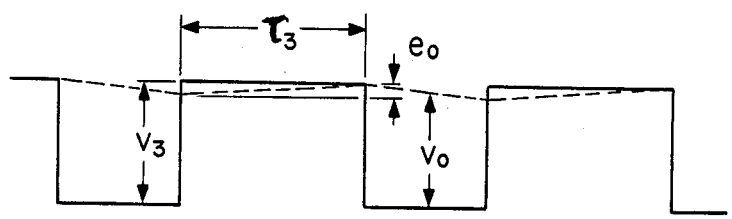

FIGS. 2A to 2C are diagrams specifically depicting the operation of the AGC circuit, as described above, and showing three different examples of burst time. Solid lines represent the detection output of the envelope detector 2, i.e. the input voltage v to the peak holding diode $X_1$. Broken lines indicate the response time of the voltage $v_0$ resulting from the charging of the capacitor $C_1$ and the detection output V. These FIGS. 2A to 2C illustrate the states of the voltage charge stored on capacitor $C_1$, upon arrival of a burst, and the discharge through the resistor $R_2$, in the absence of a burst. The charge and the discharge are equivalent and stably, in an equilibrium. In FIG. 2A, $\tau_f/\tau_1 = 10$; in FIG. 2B, $\tau_f/\tau_2 = 5$; and in FIG. 2C, $\tau_f/\tau_3 = 1.67$ ($\tau_1$ through $\tau_3$ are burst times and $\tau_f$ is the frame time). The $\tau_f/\tau$ ratios in FIGS. 2A to 2C are shown smaller than they really are, with a view to simplifying the explanation. They have to be greater in an actual circuit: $\tau_f/\tau_1 = 1000$ for FIG. 2A, $\tau_f/\tau_2 = 100$ for FIG. 2B, and $\tau_f/\tau_3 = 10$ for FIG. 2C.

As the positions of the broken lines in FIGS. 2A to 2C indicate, the AGC circuit operates through its negative feedback circuit so that, even if the length of the arriving burst $\tau(\tau_1, \tau_2$ or $\tau_3)$ varies, the voltage $v_0$ is stored on the capacitor $C_1$ and remains substantially the same. Therefore, a charge is required to compensate for the electric potential $e_0$ discharged by the discharging resistor $R_2$ within the burst time even if the time becomes shorter. The three voltage values $V_3$, $V_2$ and $V_1$ manifested by the amplified detecting voltage v for charging will increase in this order as the burst time successively shortens from $\tau_3$ to $\tau_1$. If the value of voltage retined by the capacitor $C_1$ is $V_0$, the voltage $(V_3 - V_0)$, $(V_2 - V_0)$ and $(V_1 - V_0)$ working on the diode $X_1$ and the two ends of the resistor $R_1$ will also increase in this order. The result is that the charging current grows and the potential $e_0$ is compensated gas, so that a sufficient charging can be achieved even if the charging time is short. However, the variation in the envelope detection voltage V ($V_1$, $V_2$, $V_3$) shows the input power to the envelope detector 3, i.e. the burst output signal p. Therefore, as stated earlier, a change in burst time in this prior art AGC circuit for burst signals would entail a variation in the output power of the AGC circuit. This is inconsistent with the intended purpose of the AGC circuit to keep its output power constant. For instance, if this circuit is used in a transmitter, it will invite a variation in transmitted power. Or, if it is applied to a receiver, the input to the decoder circuit will vary and consequently the receiving function will be adversely affected.

Figures 3, 4:
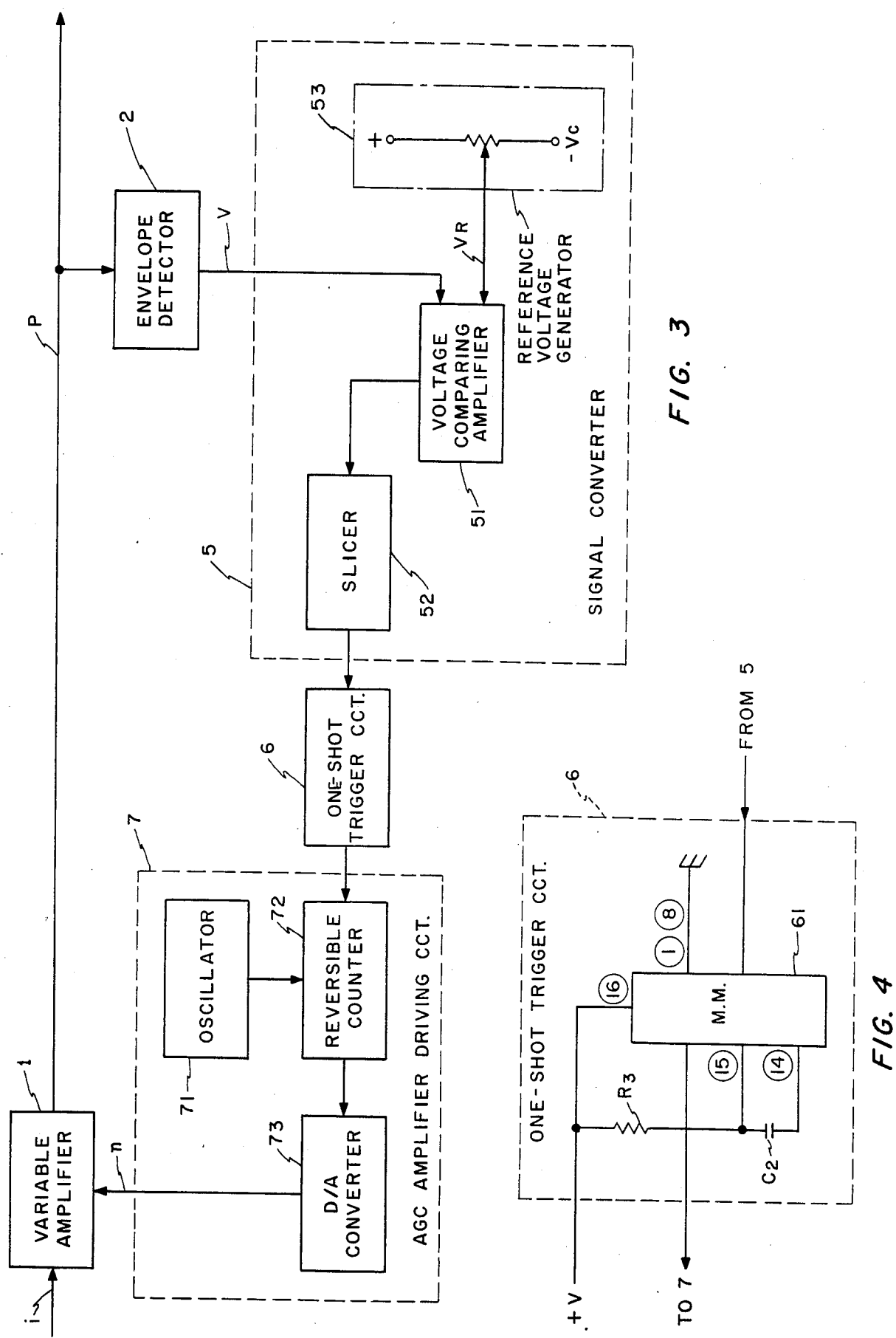
FIG. 3 is a block diagram illustrating one embodiment of the AGC circuit for burst signals, according to the present invention.
FIG. 4 shows a specific embodiment of the one-shot trigger circuit illustrated in FIG. 3.

To obviating this disadvantage of the prior art AGC circuit, the present invention provides an improved AGC circuit, as shown in FIG. 3, wherein components bearing the same symbols are identically structured, as compared with the corresponding components in FIG. 1. Thus, reference numeral 1 identifies a variable amplifier, and 2, an envelope detector. In addition, a signal converter 5 converts a signal envelope-detected by the envelope detector 2 into a binary signal by comparing the detected envelope with a prescribed threshold level $V_R$. A pulse generator circuit 6 consists, for example, of one-shot trigger circuit for providing a pulse signal of a predetermined pulse width in response to the binary signal. A variable amplifier driving circuit 7 is an AGC amplifier driving circuit for controlling the gain of the variable amplifier 1 by digitally processing the maintained signal. The signal converter 5 further comprises a voltage comparing amplifier 51, a slicer 52 and a reference voltage generator 53. The variable amplifier driving circuit 7 further comprises an oscillator circuit 71 for generating clock pulses at a clock frequency fc. A reversible counter 72 counts clock pulses, up or down, under control of the output of the one-shot trigger circuit 6. A digital-to-analog (D/A) converter 73 converts the output of the reversible counter 72 into an analog signal and controls the gain of the variable amplifier 1. The AGC circuit includes a negative feedback circuit comprising the detector 2, the converter 5, and the circuits 6 and 7.

Next, the operation of the circuit illustrated in FIG. 3 will be described.

The voltage comparing amplifier 51 compares the output voltage v of the detector 2 and the reference voltage $V_R$ provided by the generator 53. The slicer 52 converts the output level of the amplifier 51 into a binary signal. Thus, the converter 5 will provide a high level (H) signal, if the output voltage v of the detector 2 is higher than the reference voltage $V_R$. Or, if the output voltage fails to reach the reference voltage level, a low level (L) signal is given.

FIG. 4 illustrates a specific embodiment of the one-shot trigger circuit 6 shown in FIG. 3. In FIG. 4, includes a monostable multivibrator 61; a resistor $R_3$; and a capacitor $C_2$. This embodiment uses a monostable multivibrator 61 (μPB 74LS123D) manufactured by NEC Corporation or an SN74LS123 unit manufactured by Texas Instruments, Inc. Terminals ① and ⑧ of the monostable multivibrator 61 are grounded; a voltage +V is supplied to terminal ⑯ ; the resistor $R_3$ is connected between terminals ⑮ and ⑯ , and the capacitor $C_2$ is connected between terminals ⑭ and ⑮ .

Figure 5A:
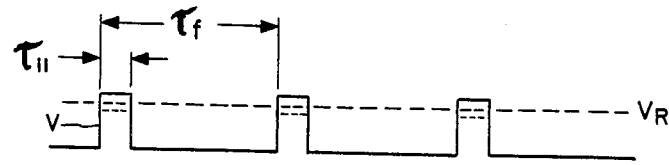
FIGS. 5A, 5B, 5C', 5C" and 5C''' are waveform diagrams for describing the operations of the signal converter and the one-shot trigger circuit.
Figure 5B:
Figure 5C:
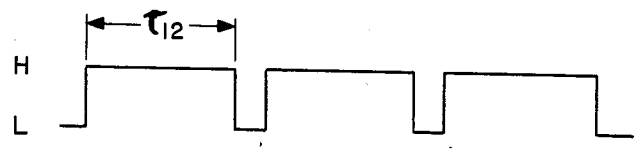
Figure 5C:
Figure 5C:

FIGS. 5A, 5B, 5C' and 5C''' are waveform diagrams for describing the operation of the signal converter 5 and the one-shot trigger circuit 6. FIG. 5A shows the output waveform v of the detector 2, where $\tau_f$ represents the repetition time of the burst and $\tau_{11}$, the burst signal time. FIG. 5B shows the output waveform of the signal converter 5, the output signal being at a high level (H) if the voltage v of FIG. 5A is higher than the reference voltage $V_R$ or at a low level (L) if it is lower. Upon receipt of the signal shown in FIG. 5B, the one-shot trigger circuit 6 extends by a time $\tau_{12}$ determined by the resistor $R_3$ and the capacitor $C_2$. If the monostable vibrator 61 shown in FIG. 4 is used, about 50 nsec (or $50 \times 10^{-9}$ seconds) will be sufficient as the burst signal time $\tau_{11}$ to extend the signal by the time $\tau_{12}$ determined by the following equation:

$$\tau_{12} = 0.45 \times C_2 \times R_3$$

FIG. 5C' shows the output waveform of the one-shot trigger circuit 6 which is achieved when the burst signal time or pulse width $\tau_{12}$ is shorter than the burst repetition time, or the frame time $\tau_f (\tau_{12} < \tau_f)$. The waveform extended by the arrival of each preceding burst continues onto the waveform resulting from the immediately following burst, so that the output of the one-shot trigger circuit circuit 6 keeps the high level (H) as shown in FIG. 5C''. Further, if the output v (FIG. 5A) of the detector 2 is lower than the reference voltage $V_R$ as represented by the dotted line, the output (FIG. 5B) of the signal converter 5 will be at the lower level (L) as indicated by the dotted line, so that the output of the one-shot trigger circuit 6 will maintain the lower level (L) shown in FIG. 5C'''.

Thus, the use of the one-shot trigger circuit 6 shown in FIG. 4 makes it possible to keep its output at the high level (H) if consecutive signals of very short burst durations have a voltage which is higher than the reference voltage $V_R$. The output is at the low level (L) in the absence of an incoming signal or if the voltage of the incoming signal does not exceed the reference voltage $V_R$. Since the one-shot trigger circuit 6 is a digital circuit, obviously, its design can be altered without difficulty so that the circuit conversely gives an output of the low level (L) in the presence of the signals and of the high level (H) in the absence of the signals. In applying the present invention, it is desirable to use a burst signal retaining a time $\tau_{12}$ which is slightly shorter than the frame time $\tau_f$.

Figure 6:
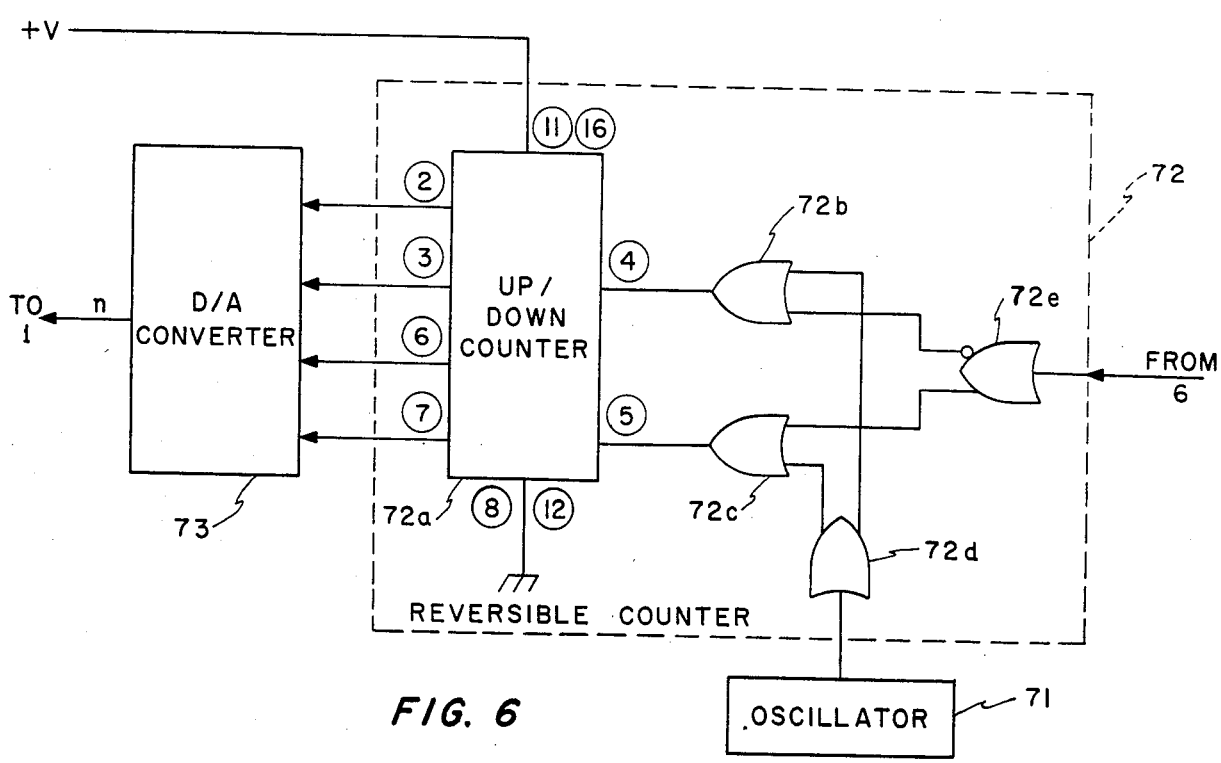
FIG. 6 shows a specific embodiment of the reversible counter illustrated in FIG. 3.

FIG. 6 illustrates a specific embodiment of the reversible counter 72 shown in FIG. 3, consisting of an up-down counter 72a and gate circuits 72b to 72d for driving the up-down counter 72a. The gate circuits 72b to 72d determine whether the clock frequency output fc of the oscillator 71 is fed directly or as a D.C. voltage of the high level (H) to the input terminal ④ or ⑤ of the up-down counter 72a. (For instance, counter 72a may be μPB74LS193C manufactured by NEC Corporation, or SN74LS196C manufactured by Texas Instruments Inc.). Depending on which terminal, ④ or ⑤ receives the output of the oscillator 71, the up-down counter 72a will count either up or down. By connecting the output terminals ②, ③, ⑥ and ⑦ to the D/A converter 73, a digital signal output from the reversible counter 72 is converted by the D/A converter 73 into an analog signal n, which is supplied to the variable amplifier 1 (FIG. 3).

Figure 7A:
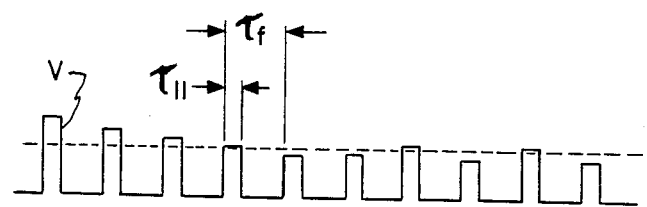
FIGS. 7A(a) to 7A(c), 7B(a) to 7B(c), 7C(a) to 7C(c) and 7D(a) to 7D(c) are waveform diagrams for describing the operation of the circuit illustrated in FIG. 3.
Figure 7A:
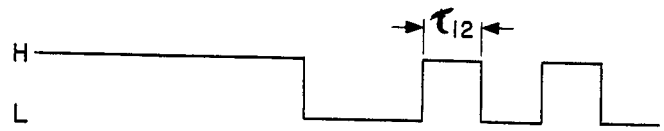
Figure 7A:
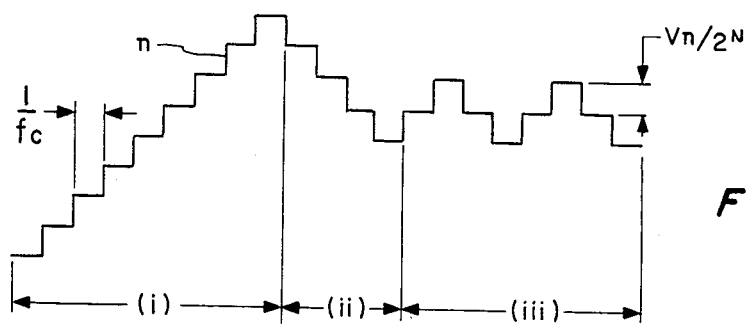

FIGS. 7A(a) to 7A(c) are waveform diagrams for describing the operation of the circuit illustrated in FIG. 3. FIG. 7A(a) shows the output waveform of the envelope detector 2; FIG. 7A(b), that of the one-shot trigger circuit 6, and FIG. 7A(c), that of the variable amplifier driving circuit 7. The figures show the initial states of the circuit, wherein there is too much power of the output p of the AGC circuit for burst signals, illustrated in FIG. 3. In FIGS. 7A(a) to 7A(b), section (i), is where the output p is gradually decreasing; section (ii), where the output p is gradually increasing; and, section (iii), where the output p is repeating alternate increases and decreases, resulting in a stable output level. The gain of the variable amplifier 1 decreases with a rise in the voltage level of the control signal (analog signal) n supplied from the variable amplifier driving circuit 7, and vice versa.

Referring now to FIG. 7A(a), the output voltage v of the envelope detector 2 is higher than the reference voltage $V_R$. The output voltage gradually decreases in section (i). There, as shown in FIG. 7A(b), the output of the one-shot trigger circuit 6 is at the high level (H) and the voltage level of the control signal n supplied from the variable amplifier driving circuit 7 is gradually rising. Next, in section (ii), the output voltage v of the envelope detector 2, as shown in FIG. 7A(a), begins at a level which is lower than the reference voltage $V_R$ and the gradually increases. In this time (ii), the output of the one-shot trigger circuit 6, as shown in FIG. 7A(b), is at the low level (L). The gradually reducing voltage level of the control signal n is supplied from the variable amplifier driving circuit 7, as shown in FIG. 7A(c). Further, in section (iii), the output voltage of the envelope detector 2, as shown in FIG. 7A(a), is alternately rising above and falling below the reference voltage $V_R$ in the cycles of each frame time $\tau_f$. Then, the output of the one-shot trigger circuit 6, as shown in FIG. 7A(b), is alternately at the high level (H) and the low level (L). The voltage level of the control signal supplied from the variable amplifier driving circuit 7 enters a stable state, as shown in FIG. 7A(c).

In the variable amplifier driving circuit 7, the clock frequency fc of the oscillator circuit 71 and the number of bits N of the D/A converter 73 can be varied in many ways depending on the requirements of the AGC circuit. Thus, if stability (section (iii) in FIG. 7A(a) to 7A(c)) has to be quickly achieved (i.e. the combined duration of sections (i) and (ii) has to be shortened), the clock frequency fc can be set higher. Or, if the range of the fluctuations in the stable state has to be narrowed, the number of bits N of the D/A converter 73 can be increased.

Therefore, as a variation of the embodiment illustrated in FIG. 3, there can be an embodiment having an oscillator circuit with two different clock frequencies. The higher frequency is selected when the output p of the AGC circuit for burst signals deviates substantially from its prescribed level. There is a switch-over to the lower frequency when the stable state has been achieved.

Figure 7B:
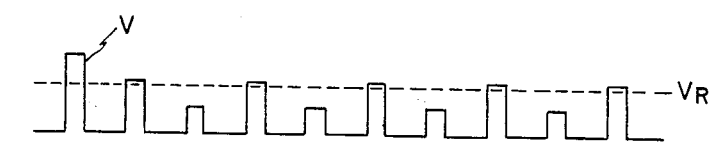
Figure 7B:
Figure 7B:
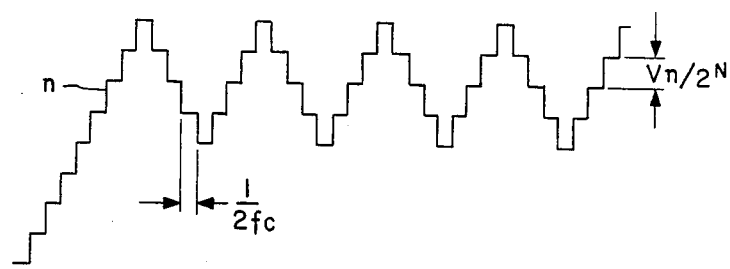

The foregoing will be explained in further detail with reference to FIGS. 7B(a) to 7D(c). FIGS. 7B(a) to 7B(c) illustrate instances in which the number of bits of the D/A converter 73 is N, as in FIGS. 7A(a) to 7A(c) and the clock frequency is 2fc. The range of control voltage levels of the control signal n is represented by $V_n$. The figures show that the time taken to achieve stability is shorter than the corresponding time in FIGS. 7A(a) to 7A(c).

FIGS. 7C(a) to 7C(c) illustrate instances in which the clock frequency is fc as in FIGS. 7A(a) to 7C(c). The number of bits of the D/A converter 73 is N+1. It is seen that the range of fluctuation in the stable state is narrower than it is in FIG. 7A.

FIGS. 7D(a) to 7D(c) illustrate instances in which the oscillating circuit has two different clock frequencies, fc and 4fc, and the number of bits of the D/A converter 73 is N+1. The figures clearly show that stability can be more quickly achieved and the range of fluctuation in the stable state is narrower.

As heretofore described, an AGC circuit for burst signals may have a very small output fluctuation by providing a negative feedback circuit out of the envelope detector 2, the signal converter 5, the one-shot trigger circuit 6, and the variable amplifier driving circuit 7, and by digitally processing the burst output of the envelope detector 2.

Since the one-shot trigger circuit 6 illustrated in FIG. 3 operates stably for very short burst signals such as 50 nsec each, it is possible to insert (FIG. 8) a low-pass filter (LPF) 8 for improving the signal-to-noise (S/N) ratio. This filter 8 is connected between the envelope detector 2 and the signal converter.

Figures 8, 9A, 9B:
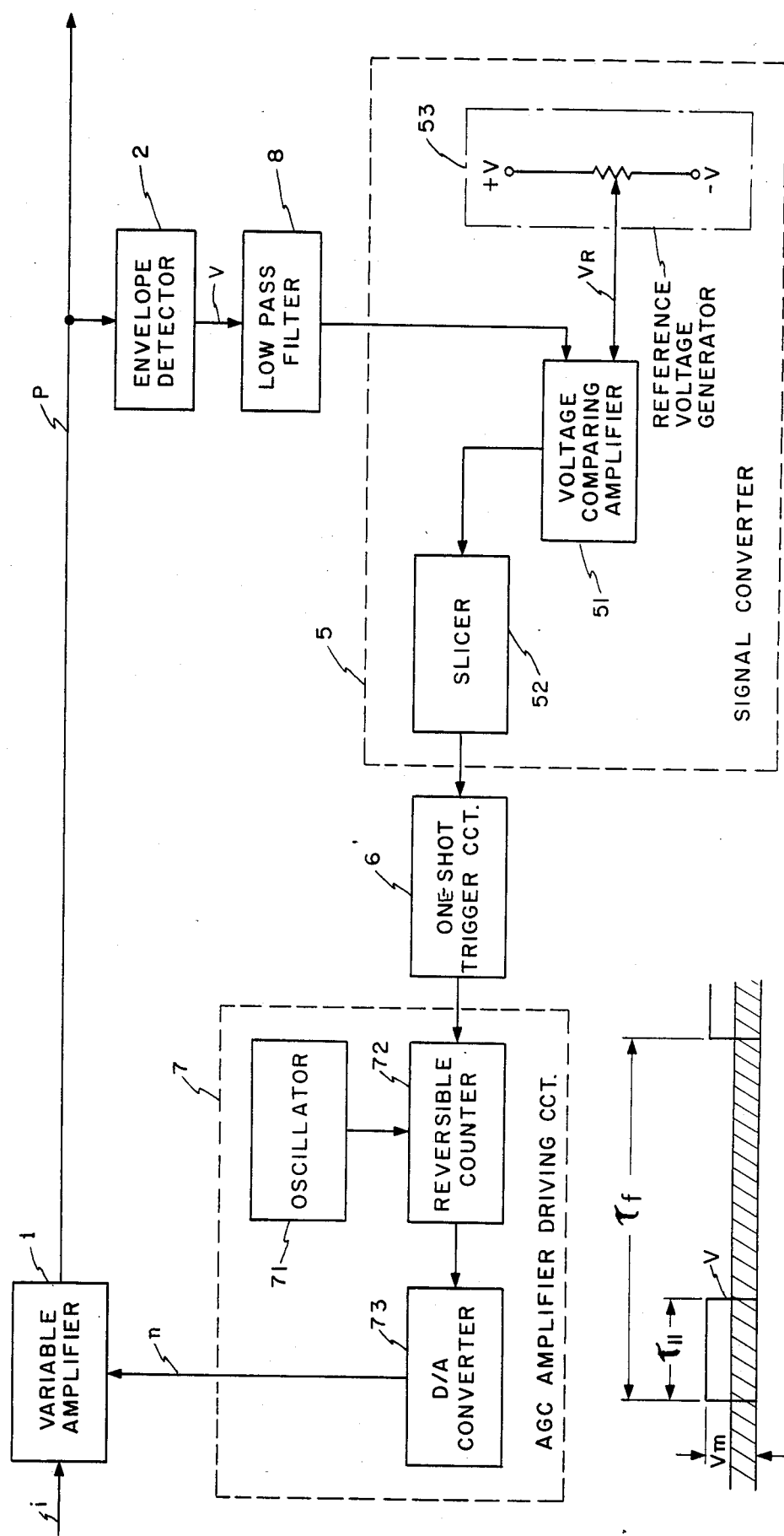
FIG. 8 is a block diagram illustrating another and preferred embodiment of the AGC circuit for receiving burst signals, representing an improvement over the circuit shown in FIG. 3.
FIGS. 9A and 9B are waveform diagrams for describing the operation of the circuit illustrated in FIG. 8.

In FIGS. 9A and 9B, waveform diagrams describe the operation of the circuit illustrated in FIG. 8. FIG. 9A shows the output waveform of the envelope detector 2 and FIG. 9B shows the output waveform of the LPF 8. The cross hatched parts in both FIGS. 9A and 9B represent the thermal noise power component. As the figure indicates, the insertion of the LPF 8 decreases the thermal noise power. However, the rise of the detection voltage for burst signals is correspondingly delayed.

In the prior art circuit illustrated in FIG. 1, it is impossible to restrict the band and thereby improve the signal-to-noise ("S/N") ratio to its required level. In contrast, in the inventive circuit illustrated in FIG. 8, the pass band of the LPF 8 can be made sufficiently narrowed to reduce the time $\tau'_{11}$, during which the waveform that has passed the LPF 8 reaches the maximum value $V_m$ of the pulse, to around 50 nsec. Therefore, the S/N ratio can be improved to its required level, so that an AGC circuit for burst signals can operate stably, even if the thermal noise power substantially fluctuates.

It is assumed here that the present AGC circuit for burst signals is used in, for example, a receiver equipment for a satellite communications system. If the circuit is a conventional one, as shown in FIG. 1, the peak power level will be held at a power value which is the sum of the power of the received signals and the thermal noise. Or, in other words, the envelope-detected output is held at peak power even if the noise power has increased as a consequence of the state of the signal propagation path. For example, power in the path may vary responsive to rainfall or attenuation. The signal power component will decrease equivalently. In contrast, the inventive circuit illustrated in FIG. 8 reduces the thermal noise power by the use of LPF 8, so that negative feedback is achieved to restore the original signal power, with only a very little added noise. The variation of the signal power component can be kept extremely small.

Figure 10:
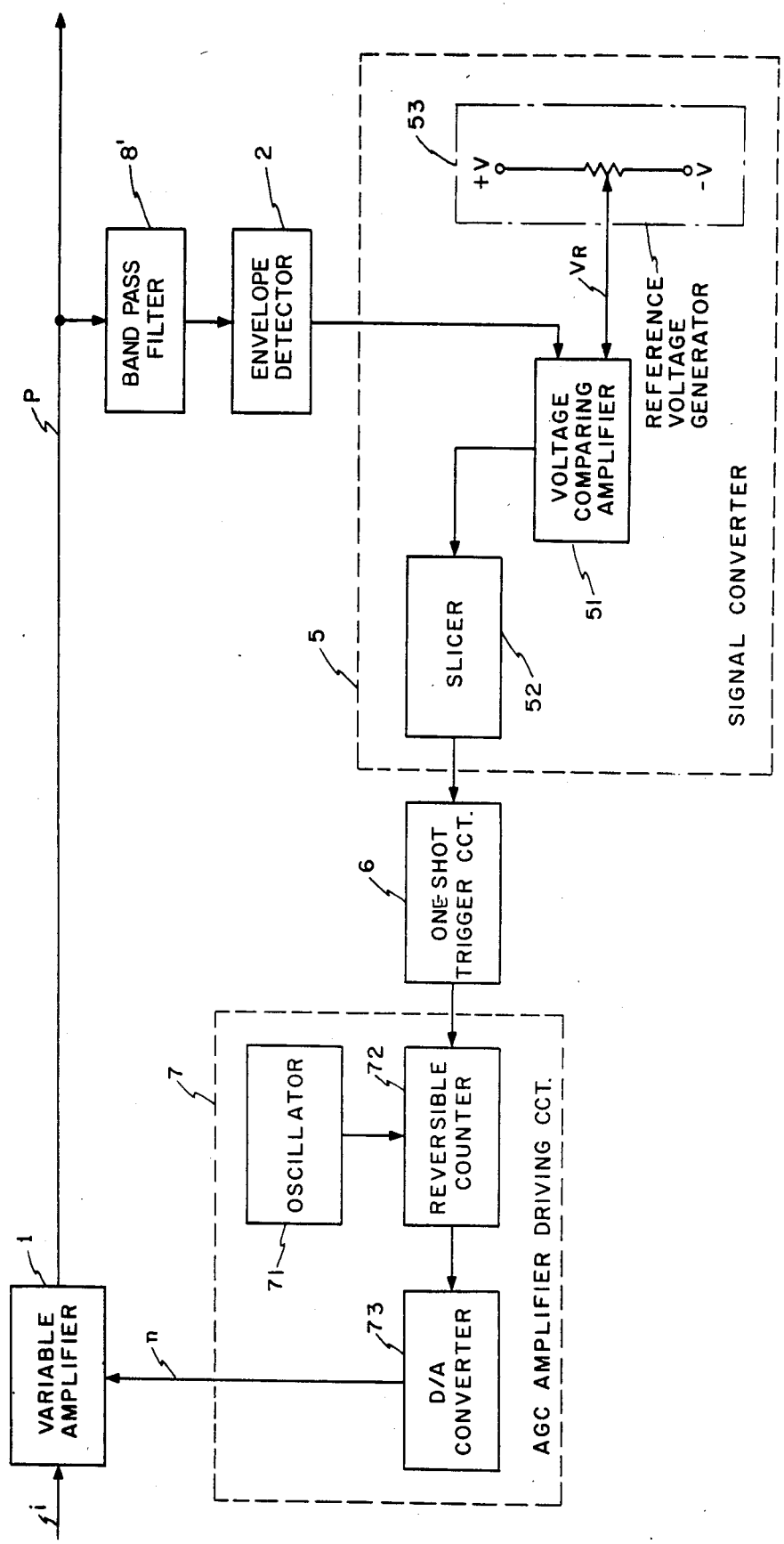
FIG. 10 is a block diagram similar to FIG. 8, which illustrates still another embodiment of the AGC circuit.

In the circuit of FIG. 8, the LPF 8 is inserted on the output side of the envelope detector 2. However, the same effect can obviously be achieved by inserting a band pass filter 8' (FIG. 10) on the input side of the envelope detector 2, as shown in FIG. 10.

As heretofore described, the present invention can provide an AGC circuit for burst communications systems. The output power variation is extremely small even if the burst time varies. Further, the invention permits the AGC circuit to operate free of trouble even if the burst time is very short. Accordingly, a filter can be inserted into the received burst detecting circuit to reduce noise. There can be realized an AGC circuit for signal reception whose received signal component will vary extremely little even if the received noise power fluctuates.

Those who are skilled in the art will readily perceive how to modify the invention. Therefore, the appended claims are to be construed to cover all equivalent structures which fall within the true scope and spirit of the invention.

We claim:

1. An automatic gain control (AGC) circuit for a burst signal communication system, comprising AGC amplifier means for receiving a burst input and for providing a burst output having a level which is controlled in response to a control signal, and negative feedback circuit means including envelope detector means for receiving the burst output and for providing the control signal, whereby the envelope detector means envelope-detects the burst output and provides a first signal, the negative feedback circuit means further comprising filter means connected to the output of the envelope detector means for eliminating noise included in the first signal, converting means for converting the first signal into a binary signal by comparing it with a reference voltage, pulse generator means for providing a pulse signal of a predetermined pulse width in response to the binary signal, and AGC amplifier driving circuit means for digitally processing the pulse signal, thereby providing the control signal.

2. An AGC circuit as claimed in claim 1, wherein the pulse generator means comprises a one-shot trigger circuit.

3. An AGC circuit as claimed in claim 2, wherein the AGC amplifier driving circuit means comprises an oscillator circuit for generating clock pulses, a reversible counter means for counting up and down the clock pulses in response to the pulse signal, and digital-to-analog converter means for converting the output of the reversible counter means and for providing the control signal.

4. The circuit of claim 5 wherein said filter means comprises a low pass filter.

5. An automatic gain control circuit for use in a burst signal communication system, said control circuit comprising amplifier means having a control terminal and operating responsive to the receipt of each burst signal for giving an amplified output burst signal, negative feedback means coupled between the output and the control terminal of said amplifier means, said negative feedback means including converter means jointly responsive to the envelope of said output burst signal and to a reference voltage for giving a binary signal representing the amplitude of said envelope of said burst signal as compared to the amplitude of said reference voltage, filter means in said negative feedback means for eliminating burst signal noise before the envelope of said burst signal reaches said converter means, pulse generator means in said negative feedback means and operated responsive to said binary signal for generating a pulse having a width representing the desired gain control, said pulse generator comprising a one-shot trigger circuit, and driving circuit means in said negative feedback means responsive to the output of said pulse generator for applying an analog control signal to said control terminal, said driving circuit means comprising a source of clock pulses, means jointly responsive to said pulse and said source of clock pulses for counting pulses, and digital-to-analog converter means for converting a predetermined number of clock pulses into said analog control signal.

6. The circuit of claim 5 wherein said filter is a low pass filter for passing the envelope of said burst signal.

7. The circuit of claim 5 wherein said filter is a band pass filter for passing said burst signal.

8. An automatic gain control circuit for a burst signal communication system, comprising AGC amplifier means for receiving a burst input and for providing a burst output having a level which is controlled in response to a control signal and negative feedback circuit means including envelope detector means for receiving the burst output and for providing the control signal, whereby the envelope detector means envelope-detects the burst output and provides a first signal, the negative feedback circuit means further comprising filter means connected to the input of the envelope detector means for eliminating noise included in the burst output, converting means for converting the first signal into a binary signal by comparing it with a reference voltage, pulse generator means for providing a pulse signal of a predetermined pulse width in response to the binary signal, and AGC amplifier driving circuit means for digitally processing the pulse signal, thereby providing the control signal.

9. The circuit of claim 8 wherein said filter means comprises a bandpass filter.

* * * * *